US012604742B2

(12) United States Patent
Tsai et al.

(10) Patent No.: US 12,604,742 B2
(45) Date of Patent: Apr. 14, 2026

(54) LAYOUT DESIGN METHOD AND STRUCTURE WITH ENHANCED PROCESS WINDOW

(71) Applicant: Taiwan Semiconductor Manufacturing Company, Ltd., Hsin-Chu (TW)

(72) Inventors: Jui-Tse Tsai, New Taipei (TW); Szu-Ling Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 515 days.

(21) Appl. No.: 18/157,887

(22) Filed: Jan. 23, 2023

(65) Prior Publication Data

US 2023/0260927 A1 Aug. 17, 2023

Related U.S. Application Data

(60) Provisional application No. 63/311,096, filed on Feb. 17, 2022, provisional application No. 63/387,446, filed on Dec. 14, 2022.

(51) Int. Cl.
*H01L 23/544* (2006.01)
*H10D 89/10* (2025.01)

(52) U.S. Cl.
CPC ........... *H01L 23/544* (2013.01); *H10D 89/10* (2025.01); *H01L 2223/54406* (2013.01)

(58) Field of Classification Search
None
See application file for complete search history.

(56) References Cited

U.S. PATENT DOCUMENTS

| | | |
|---|---|---|
| 2005/0105792 A1 | 5/2005 | Cao et al. |
| 2012/0120758 A1* | 5/2012 | Cohn ................ H01L 21/76838 |
| | | 367/87 |
| 2015/0048525 A1 | 2/2015 | Ausschnitt et al. |
| 2018/0210332 A1 | 7/2018 | Slonaker et al. |
| 2020/0066648 A1* | 2/2020 | Chen ..................... G06F 30/392 |

* cited by examiner

*Primary Examiner* — Stephanie P Duclair
(74) *Attorney, Agent, or Firm* — HAYNES AND BOONE, LLP

(57) ABSTRACT

The present disclosure provides a method that includes receiving a circuit layout that includes circuit features and a mark pattern to be formed on a same material layer over an integrated circuit (IC) substrate, the circuit features being longitudinally oriented along a first direction and being distanced from each other along a second direction that is orthogonal to the first direction; fragmenting the mark pattern to generate a fragmented mark pattern having fragmented mark features such that the fragmented mark features are configured in parallel and are longitudinally oriented along a third direction; and generating a modified circuit layout for circuit fabrication, the modified circuit layout including the circuit features and the fragmented mark pattern.

20 Claims, 16 Drawing Sheets

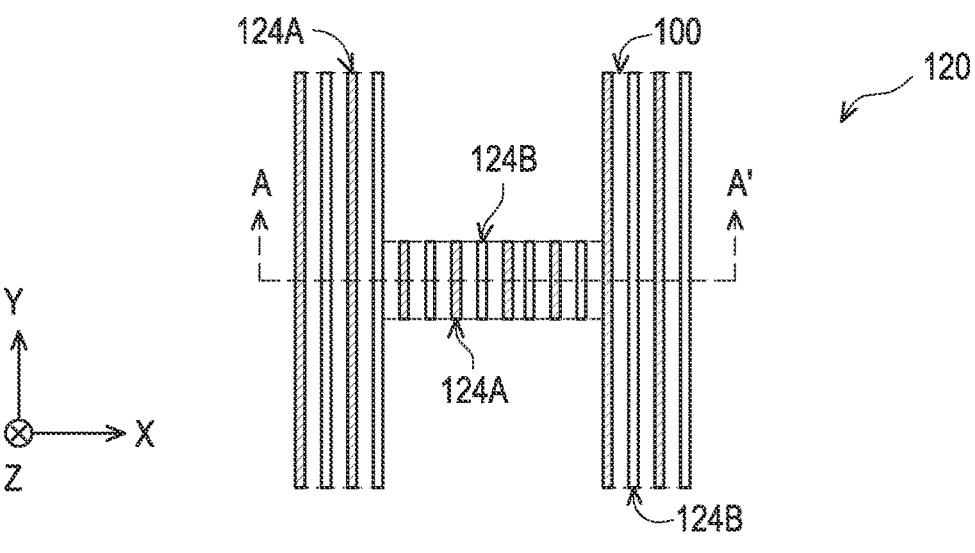
FIG. 4A
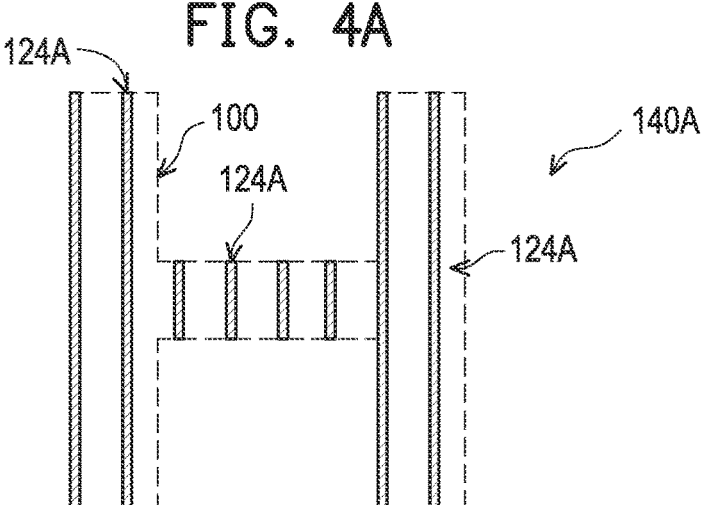
FIG. 4B
FIG. 4C

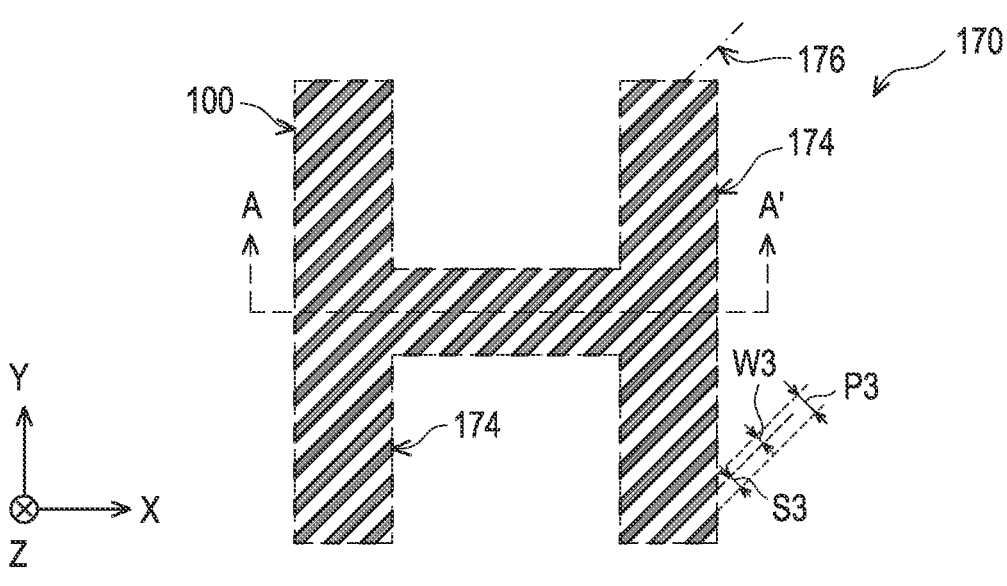
FIG. 7A
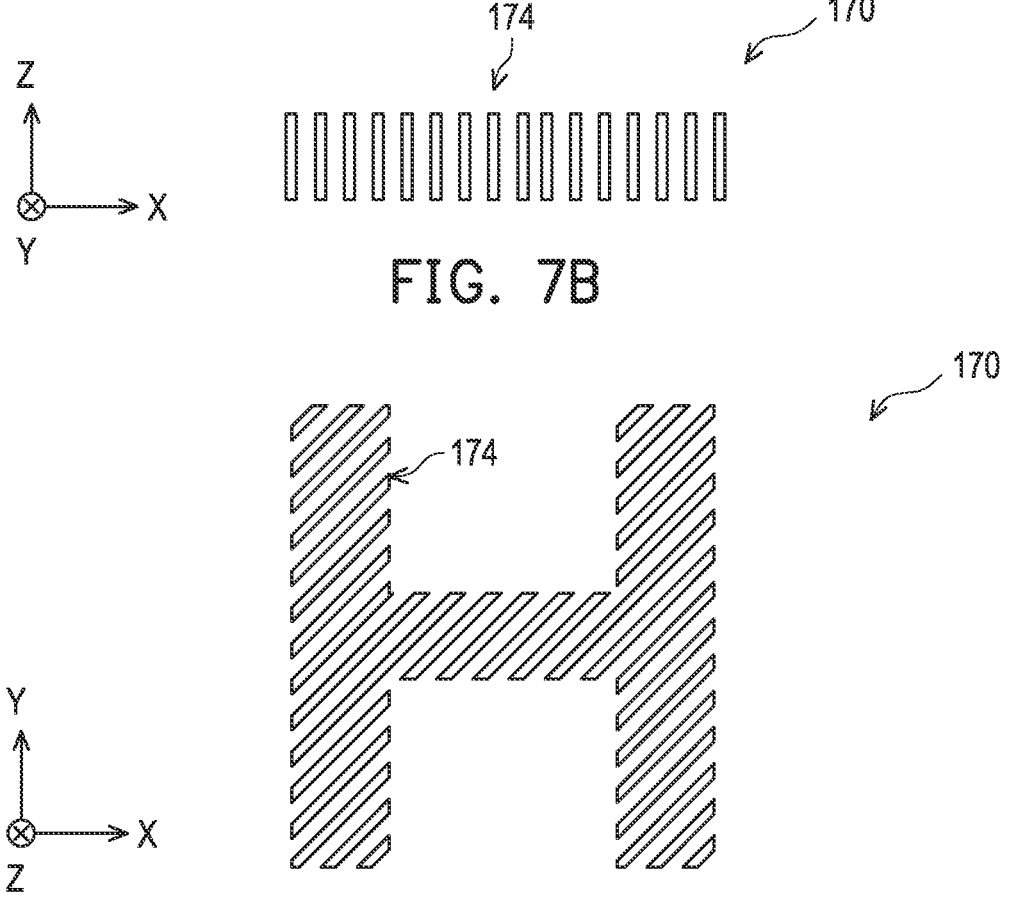
FIG. 7B
FIG. 7C

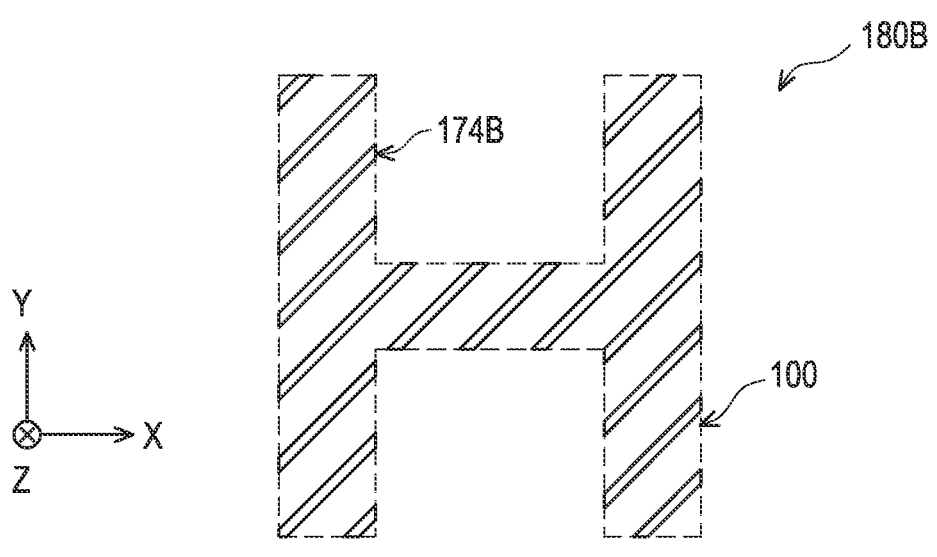
FIG. 8C
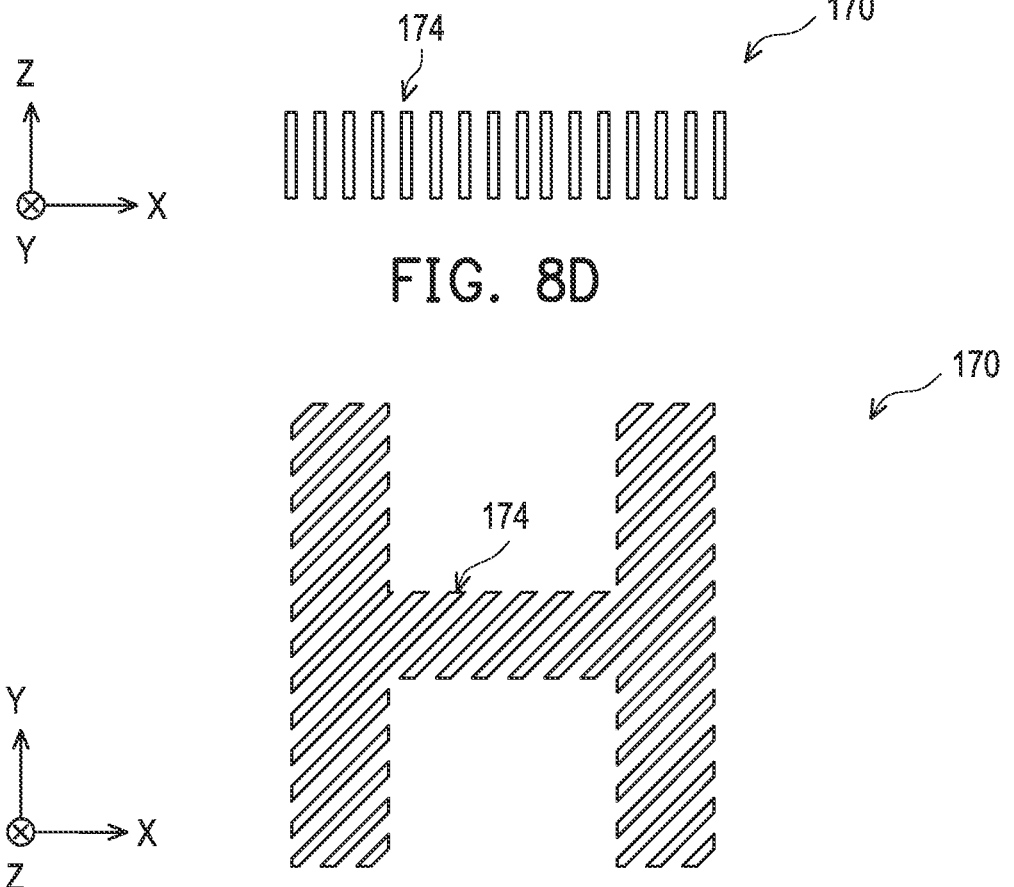
FIG. 8D
FIG. 8E

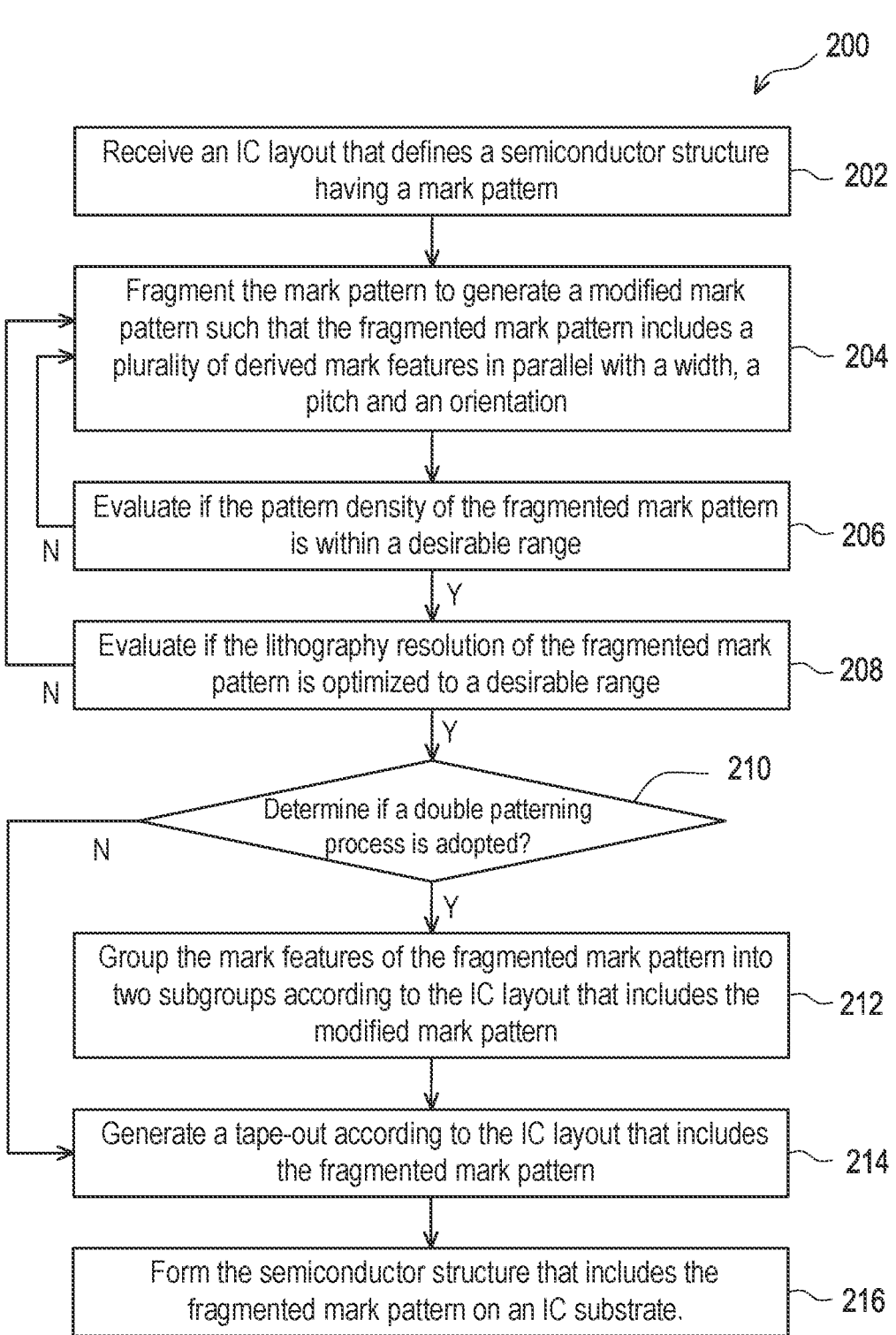

200

Receive an IC layout that defines a semiconductor structure having a mark pattern — 202

Fragment the mark pattern to generate a modified mark pattern such that the fragmented mark pattern includes a plurality of derived mark features in parallel with a width, a pitch and an orientation — 204

Evaluate if the pattern density of the fragmented mark pattern is within a desirable range — 206

N

Y

Evaluate if the lithography resolution of the fragmented mark pattern is optimized to a desirable range — 208

N

Y

Determine if a double patterning process is adopted? — 210

N

Y

Group the mark features of the fragmented mark pattern into two subgroups according to the IC layout that includes the modified mark pattern — 212

Generate a tape-out according to the IC layout that includes the fragmented mark pattern — 214

Form the semiconductor structure that includes the fragmented mark pattern on an IC substrate. — 216

FIG. 9

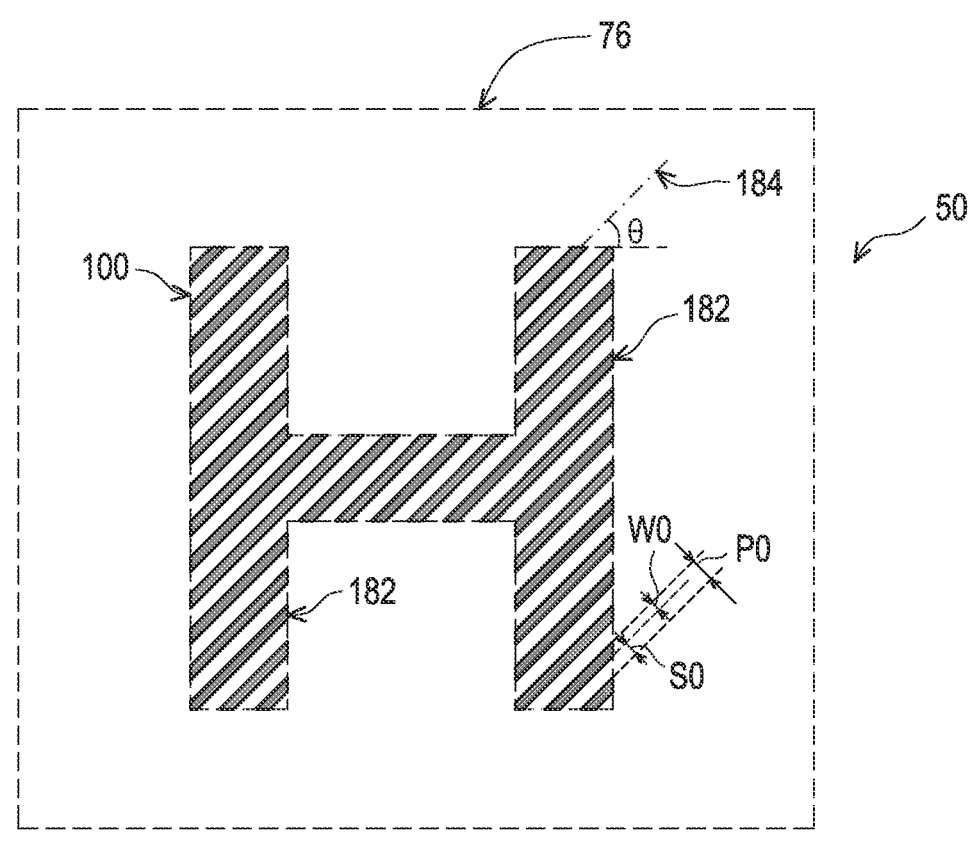
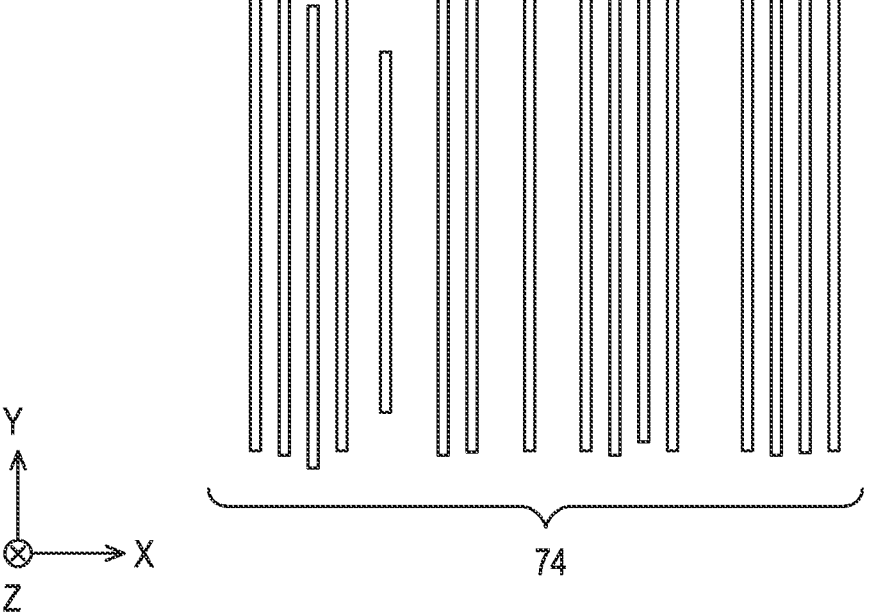
FIG. 10A

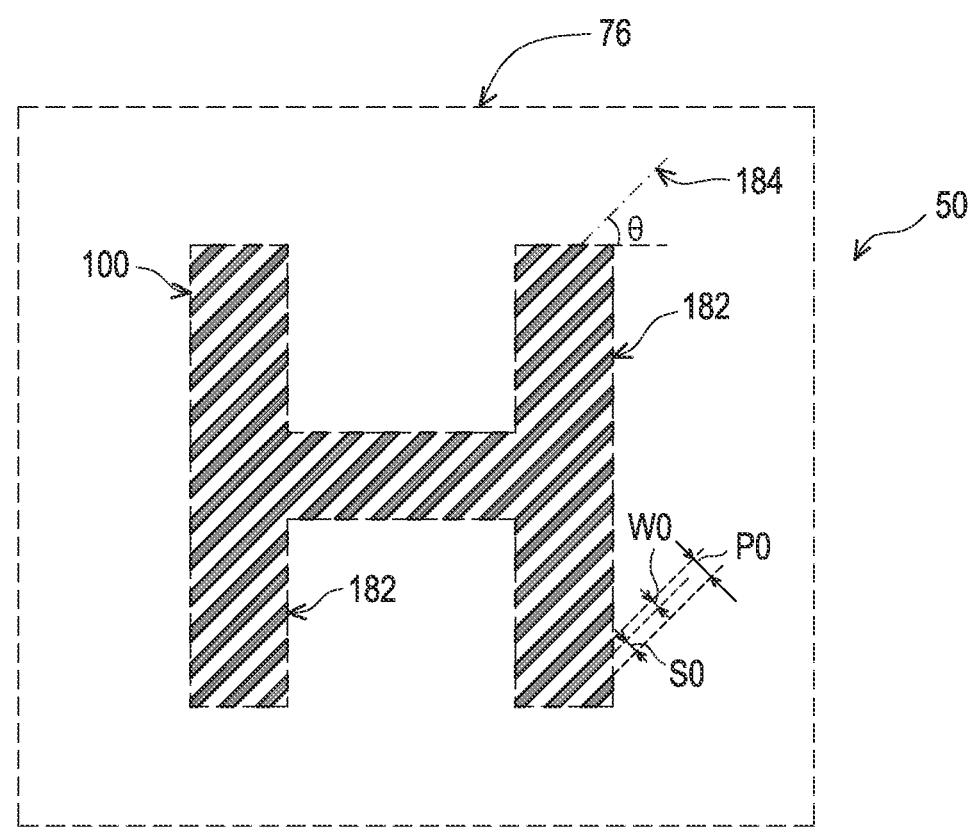
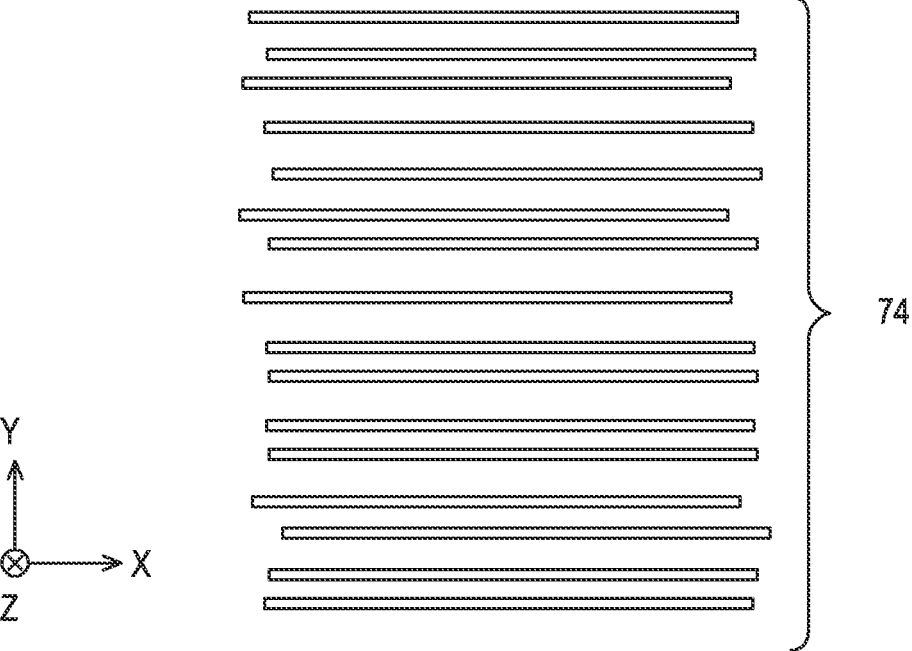
FIG. 10B

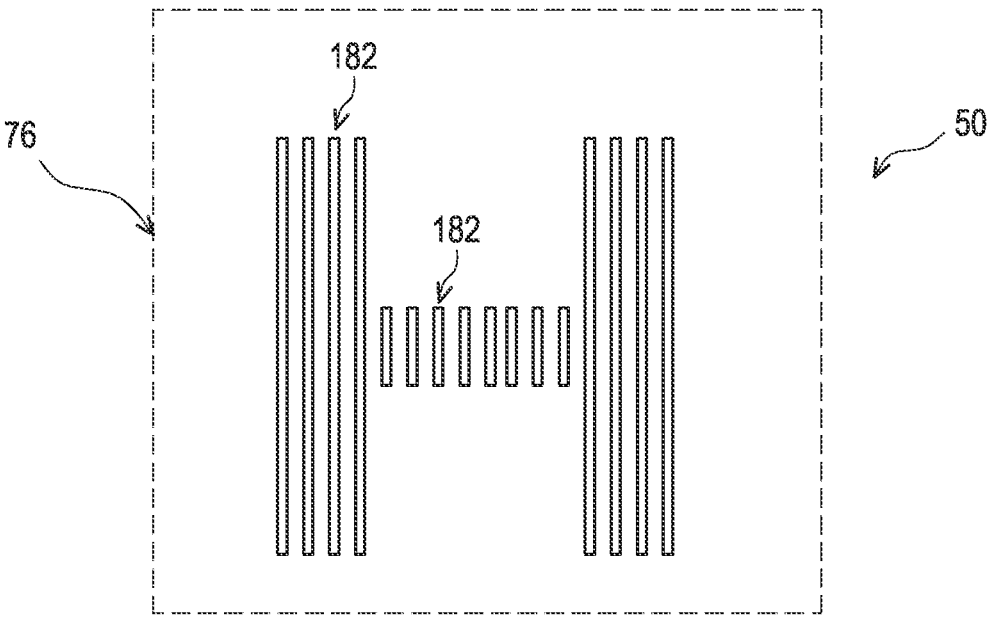
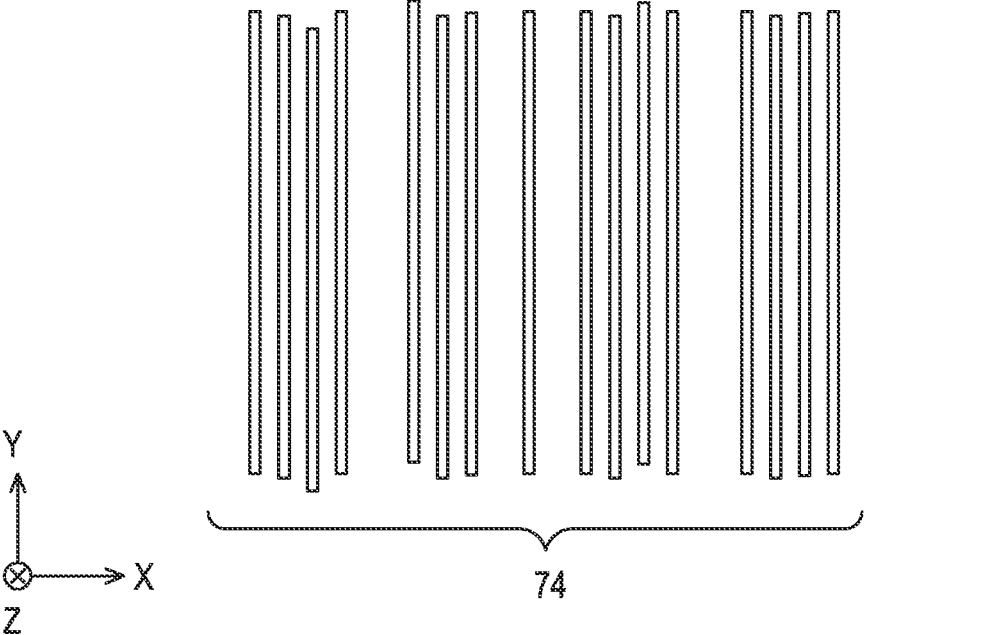
FIG. 10C

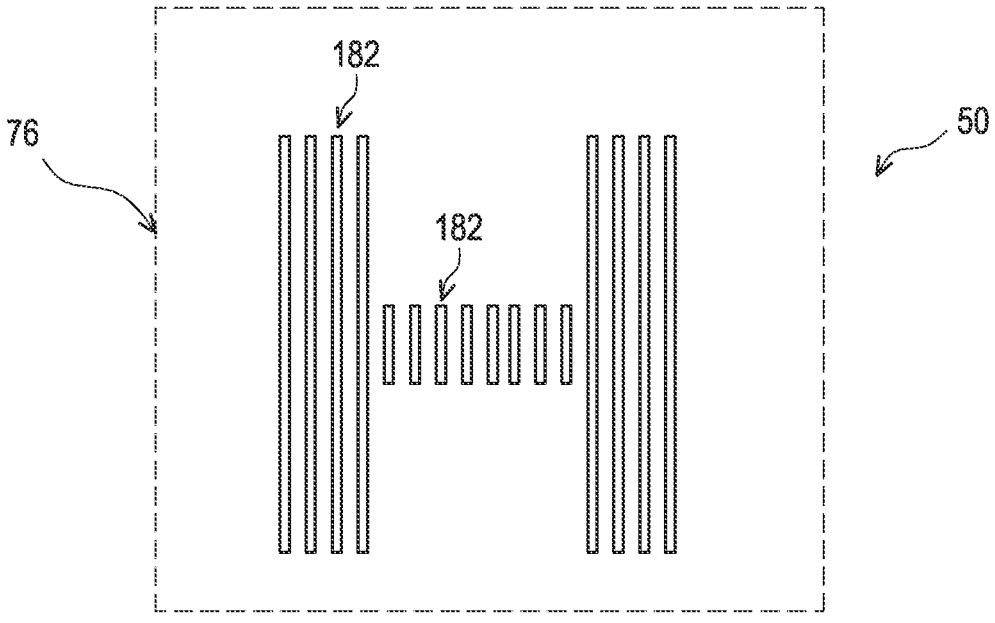
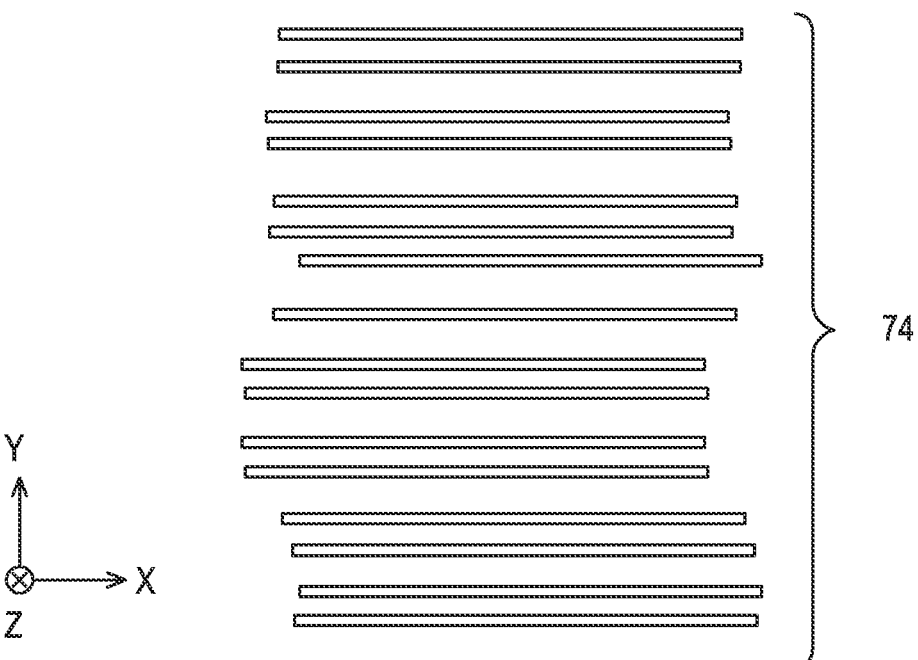
FIG. 10D

LAYOUT DESIGN METHOD AND STRUCTURE WITH ENHANCED PROCESS WINDOW

This application claims priority to U.S. Provisional Patent Application Ser. No. 63/311,096 filed Feb. 17, 2022, and U.S. Provisional Patent Application Ser. No. 63/387,446 filed Dec. 14, 2022, the entire disclosures of which are hereby incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes and introduced various challenges to the IC fabrication and reduced process windows. Thus, realizing continued advances in IC devices and their performance requires similar advances in IC manufacturing processes and technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a top view of a mark feature constructed in accordance with some embodiments.

FIGS. 4B and 4C are top views of photomasks having the mark feature of FIG. 4A constructed in accordance with some embodiments.

FIG. 7A is a top view of a mark feature constructed in accordance with some embodiments.

FIG. 7B is a sectional view of the mark feature along AA' of FIG. 7A formed on an IC substrate in accordance with some embodiments.

FIG. 7C is a top view of the mark feature of FIG. 7A formed on the IC substrate in accordance with some embodiments.

FIGS. 8B and 8C are top views of photomasks having the mark feature of FIG. 8A constructed in accordance with some embodiments.

FIG. 8D is a sectional view of the mark feature along AA' of FIG. 8A formed on an IC substrate in accordance with some embodiments.

FIG. 8E is a top view of the mark feature of FIG. 8A formed on the IC substrate in accordance with some embodiments.

FIG. 9 is a flowchart of an integrated circuit fabrication method in accordance with some embodiments.

FIGS. 10A, 10B, 10C and 10D are top views of the semiconductor structure of FIG. 1A constructed in accordance with various embodiments.

DETAILED DESCRIPTION

Figure 1A:
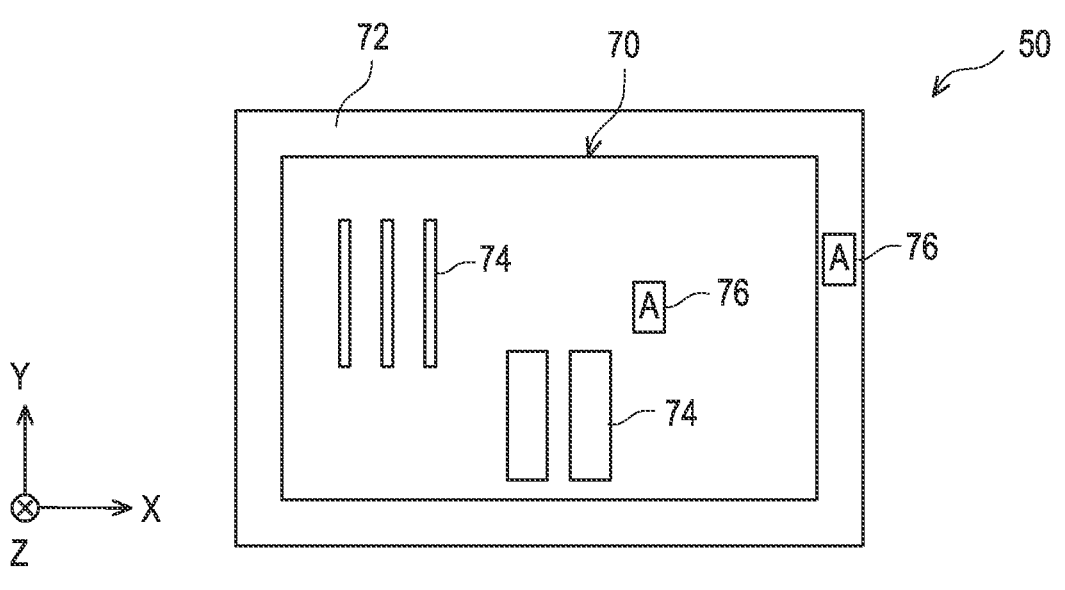
FIG. 1A is a top view of a semiconductor structure in accordance with some embodiments.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one feature relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described, or other values as understood by person skilled in the art. For example, the term "about 5 nm" encompasses the dimension range from 4.5 nm to 5.5 nm.

The present disclosure is about an integrated circuit (IC) layout and method to modify the IC layout for IC fabrication such that a designed pattern can be fabricated on a semiconductor substrate having a modified pattern with improved process window in advanced technology nodes. The method fabricating the IC structure includes fabricating the designed pattern according to the modified pattern. In some embodiments, the method includes generating a modified pattern according to the received design pattern and may further includes making the modified pattern by double patterning or multiple patterning. Particularly, the modified pattern is further divided into two or more subsets, such as two subsets, wherein the method includes performing a first patterning according to the first subset and performing a second patterning according to the second subset, thereby the modified pattern is collectively formed on an IC substrate, such as a semiconductor substrate, through the first and second patterning processes.

The disclosed IC layout and the method making the same provide various features and advantages of the present disclosure according to various embodiments. The method includes receiving an IC design layout having a first feature longitudinally oriented along a first direction and a second feature longitudinally oriented along a second direction that is being orthogonal to the first direction; abstracting portions of the first and second features such that the first and second features are converted into a plurality of derived features longitudinally oriented along a third direction; and generating a modified circuit layout for circuit fabrication according to the plurality of derived features. The modified circuit layout is able to be formed on an IC substrate with improved process window. Especially, the method provides more tuning freedom to increase process window. For example, the orientation, width and pitch of the derived features can be tuned to adjust the pattern density and increase the process window during corresponding processing. In some embodiments, the mark features are oriented in X and Y directions while the orientation of the derived features is oriented in a tilted titled direction that is different from X and Y directions. Furthermore, the mark features of the IC layout may be formed in various material layers of the IC structure, such as active regions, gate electrodes, metal lines, contacts, vias, metal features in a redistribution layer (RDL), bonding pads or a combination thereof.

The present disclosure is directed to, but not otherwise limited to, a field-effect transistor (FET) device. The FET device, for example, may be a complementary metal-oxide-semiconductor (CMOS) device including a P-type metal-oxide-semiconductor (PMOS) FET device and an N-type metal-oxide-semiconductor (NMOS) FET device. The FET may be two-dimensional (planar FET) or three-dimensional, such as a fin-type FET (FinFET). multiple gate devices, such as gate-all-around (GAA) devices. The following disclosure will continue with a FinFET example to illustrate various embodiments of the present invention. It is understood, however, that the application should not be limited to a particular type of device, except as specifically claimed.

Figure 1B:
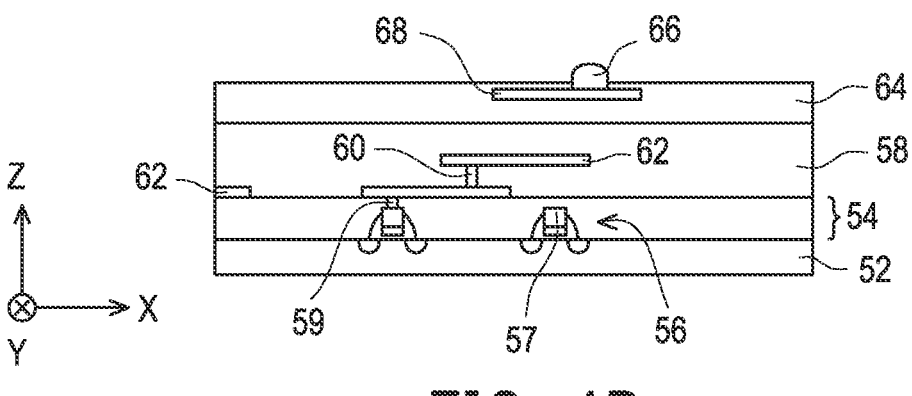
FIG. 1B is a sectional view of the semiconductor structure in FIG. 1A in accordance with some embodiments.
Figure 1C:
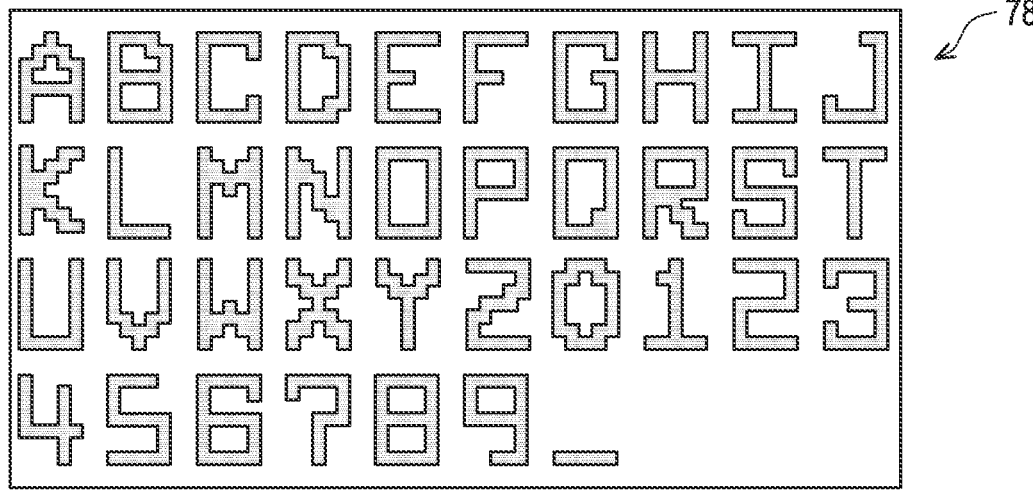
FIG. 1C illustrates top views of a mark features of the semiconductor structure in FIG. 1A in accordance with some embodiments.

FIG. 1A is a top view of a semiconductor structure (or workpiece) 50; FIG. 1B is a sectional view of the semiconductor structure 50, and FIG. 1C illustrates top views of various mark features in the semiconductor structure 50, constructed in accordance with some embodiments.

Referring to FIGS. 1A and 1B, the semiconductor structure 50 includes a substrate 52 (such as a silicon wafer). X and Y directions define a surface of the substrate 52 while Z direction defines a direction that is normal to the surface of the substrate 52. In the depicted embodiment, substrate 52 includes silicon. Alternatively, or additionally, substrate 52 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 52 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 52 can include various doped regions depending on design requirements. For example, substrate 52 includes a p-type doped region (referred to hereinafter as a p-well), which can be configured for n-type transistors, and an n-type doped region (referred to hereinafter as an n-well), which can be configured for p-type transistors. N-type doped regions, such as n-well, are doped with n-type dopants, such as phosphorus, arsenic, other n-type dopant, or combinations thereof. P-type doped regions, such as p-well, are doped with p-type dopants, such as boron, indium, other p-type dopant, or combinations thereof. In some implementations, substrate 52 includes doped regions formed with a combination of p-type dopants and n-type dopants. The various doped regions can be formed directly on and/or in substrate 52, for example, providing a p-well structure, an n-well structure, a dual-well structure, a raised structure, or combinations thereof. An ion implantation process, a diffusion process, and/or other suitable doping process can be performed to form the various doped regions.

The semiconductor structure 50 includes various devices 54, such as transistors 56, resistors, capacitors, inductors, other devices, or a combination thereof, formed on the substrate 52. The semiconductor structure 50 further includes an interconnect structure 58 formed over the substrate 52 and configured to couple various devices to an integrated circuit. The interconnect structure 58 includes a combination of dielectric layers and electrically conductive layers (e.g., metal layers) configured to form various interconnect features. The conductive layers are configured to form vertical interconnect features, such as device-level contacts 59 and/or vias 60, and/or horizontal interconnect features, such as conductive lines 62. Vertical interconnect features typically connect horizontal interconnect features in different layers (or different planes) of the interconnect structure. During operation, the interconnect features are configured to route signals between the devices and/or the components of the devices (such as gate electrode 57 of the transistor 56) and/or distribute signals (for example, clock signals, voltage signals, and/or ground signals) to the devices and/or the components of the devices. The semiconductor structure 50 also includes a passivation layer 64 that provides sealing and protection effect to the integrated circuit. The passivation layer 64 includes one or more suitable passivation material, such as silicon nitride, silicon oxide, other suitable dielectric material, or a combination thereof. The passivation layer 64 also includes bonding pads 66 formed thereon. The passivation layer 64 may include other devices/components, such as redistribution layer (RDL) 68 having various conductive features configured to redistribute bonding pads 66 and connect the bonding pads 66 to the interconnect structure 58.

As illustrated in FIG. 1A, the semiconductor structure 50 includes a circuit region 70 and a periphery region 72 (such as scribe lines) surrounding the circuit region 70. The semiconductor structure 50 includes various circuit features 74, such as source/drain features and a gate electrode (e.g., 57) of a transistor (e.g., 56), metal lines, bonding pads and etc., formed within the circuit region 70 over the substrate. The semiconductor structure 50 further includes a mark pattern (or LOGO pattern) 76 formed over the substrate 52, such as in the periphery region 72, in the circuit region 70, or both. A mark pattern is a pattern designed to identify various product-related information, such as customer information, product ID, lot ID, and etc. The mark pattern includes a character, a word, a number, a symbol, or a combination thereof, such as those 78 illustrated in FIG. 1C. The mark pattern 76 is collectively formed with corresponding circuit features and may be formed in a same material layer of the semiconductor structure 50. Furthermore, the circuit features and the mark pattern 76 are defined on a same photomask; and are formed simultaneously by a same procedure that includes a lithography process using the photomask.

For example, the mark pattern 76 may be formed with gate electrodes. In this case, the mark pattern 76 is simultaneously formed with the gate electrodes in the circuit region 70 and may have similar compositions. Only the mark pattern 76 has a shape and geometry designed with a certain pattern to carry product-related information. In various embodiments, the mark pattern 76 may be simultaneously formed with gate electrodes, contacts, metal lines, vias, bonding pads, or a combination thereof.

In the following descriptions, the structure and the method making a mark pattern are provided according to various embodiments. An exemplary mark pattern including "H" is used to illustrate the structure and the method making the same. However, it is understood that this is only one example for illustration, the method and structure are also applicable to any suitable other suitable mark patterns.

Figure 2A:
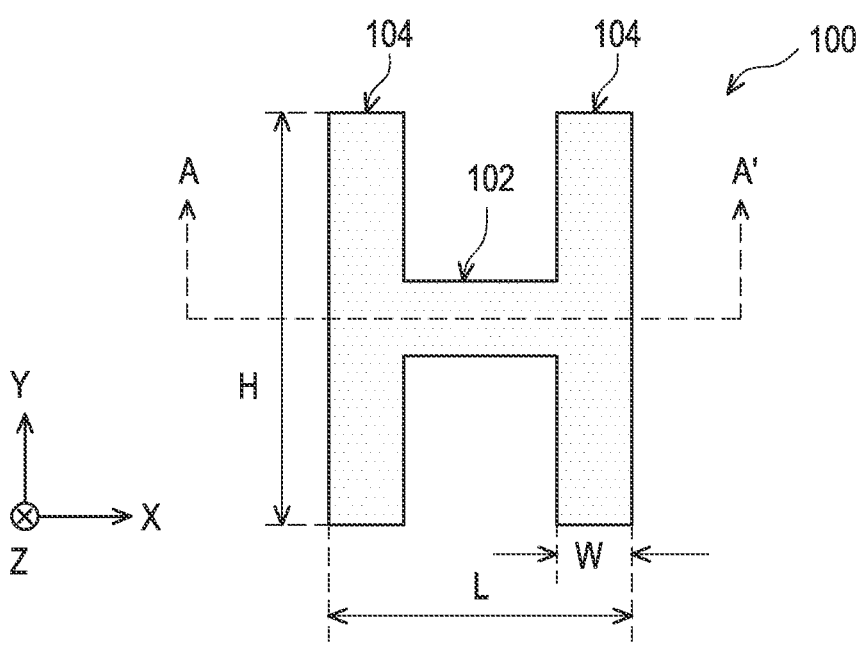
FIG. 2A is a top view of a mark feature in accordance with some embodiments.
Figure 2B:
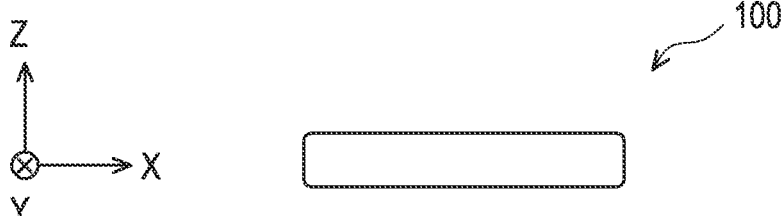
FIG. 2B is a sectional view of the mark feature along AA' of FIG. 2A formed on an IC substrate in accordance with some embodiments.
Figure 2C:
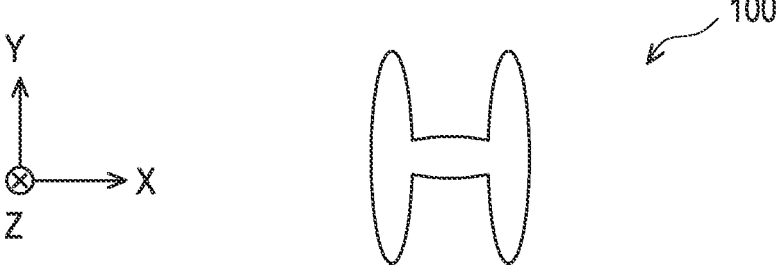
FIG. 2C is a top view of the mark feature of FIG. 2A formed on the IC substrate in accordance with some embodiments.

Turning to FIGS. 2A-2C, a mark pattern 100 is illustrated in FIG. 2A. The mark pattern 100 in a design layout is transferred to a substrate 52 using a patterning process that further includes a lithography process and etching, thereby forming the mark pattern 100 on the substrate 52, as illustrated in FIG. 2B in a top view and in FIG. 2C in a sectional view. The mark pattern 100 formed on the substrate 52 includes various dimensions that are usually substantially greater than those of the circuit features formed in the same layer over the substrate 52. For example, the mark pattern 100 includes a mark length L and a mark height H, each ranging between 1 μm and 100 μm. In the present example, the mark pattern 100 includes one or more mark feature 102 longitudinally oriented along X direction and one or more mark feature 104 longitudinally oriented along Y direction. The mark features (102 and 104) include a feature width W ranging between 0.5 μm and 50 μm. In this case, the local pattern density of the mark pattern 100 is substantially different form the pattern density of circuit features. Especially, the local pattern density in the region where the mark pattern presents is not uniform. For example, some areas of the mark pattern 100 have a local pattern density close to 0% and some areas of the mark pattern 100 have a local pattern density close to 100%. This uneven pattern density will cause fabrication issues, such as uneven loading effect of subsequent process(es) (etching, chemical mechanical polishing (CMP), other processes or a combination thereof). This uneven loading effect reduces the process window and degrade the fabrication quality.

Figures 3A, 3B, 3C:
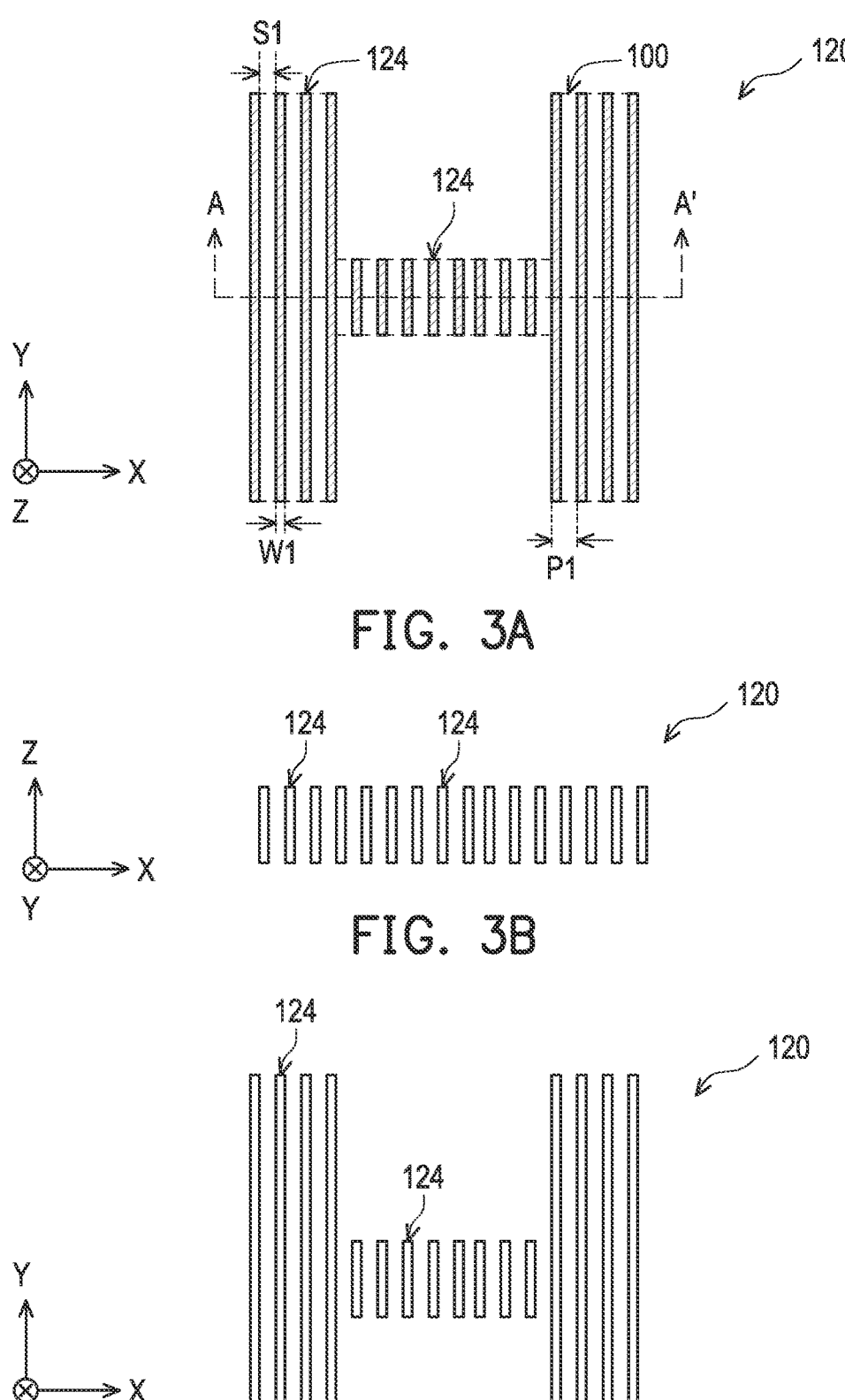
FIG. 3A is a top view of a mark feature constructed in accordance with some embodiments.
FIG. 3B is a sectional view of the mark feature along AA' of FIG. 3A formed on an IC substrate in accordance with some embodiments.
FIG. 3C is a top view of the mark feature of FIG. 3A formed on the IC substrate in accordance with some embodiments.

Turning to FIGS. 3A-3C, a mark pattern 120 is illustrated in FIG. 3A. The original mark pattern in a design layout is same to the mark pattern 100 in FIG. 2A and is therefore presented in FIG. 3A by a dotted contour 100. In the present embodiment, the original mark pattern 100 is received and fragmented to generate a fragmented mark pattern (modified mark pattern) 120, which includes a plurality of fragmented mark features (derived mark features) 124. The fragmented mark features 124 are straight lines configured in parallel and are longitudinally oriented along a same direction. The fragmented mark features 124 collectively represent the original mark pattern 100 and are recognizable as the original mark pattern 100. This can be further explained below.

When the ends of the fragmented mark features 124 are connected, they form a closed line as the contour of the original mark pattern. In another perspective, by filling the gaps of the fragmented mark features 124, the fragmented mark pattern 120 is converted to the original mark pattern 100.

The fragmentation of the received mark pattern 100 may be achieved by any suitable method, such as by abstracting portions of the received mark pattern 100. In some embodiments, the mark pattern 100 is received and modified by abstraction to generate a modified mark pattern 120, which includes a plurality of derived mark features 124 oriented in parallel. The derived mark features 124 are longitudinally oriented in the same direction (longitudinal direction). The modified mark pattern 120 may be generated by abstracting portions of the designed mark pattern 100. In furtherance of the embodiment, the derived mark features 124 of the modified mark pattern 120 are configured in a periodic structure. The derived mark features 124 are designed with a same width W1 and configured with a same spacing S1 and a same pitch P1. The width W1, spacing S1 and pitch P1 span along a direction being orthogonal to the longitudinal direction of the derived mark features. The pitch P1 is defined as a periodic dimension from one derived mark feature 124 to an adjacent derived mark feature 124, such as between the same corresponding edges of the adjacent derived mark features 124. The pitch P1 is related with the width W1 and spacing S1 by P1=W1+S1. By tunning the dimensions P1 and W1 (or S1 and W1), the pattern density of the modified mark pattern 120 can be tuned, such as reduced. The ratio W1/P1 may determine a local pattern density D. When the ratio W1/P1 is reduced, such as by reducing W1, increasing P1 or a combination thereof, the local pattern density is reduced. When the ratio W1/P1 is increased, such as by reducing P1, increasing W1 or a combination thereof, the local pattern density is increased. In the disclosed embodiment, W1 ranges between 0.001 μm and 2 μm, and S1 ranges between 0.001 μm and 2 μm.

The orientation of the derived mark features 124 also provides a freedom to tune various process effects, such as pattern uniformity or lithography process. Proper orientation of the derived mark features 124 can effectively enhance the lithography resolution. As one example for illustration, the mark pattern 120 is formed with metal lines in one metal layer, such as the first metal layer, the second metal layer or etc. The metal lines of the same metal layer in the circuit region are oriented in a same direction, such as Y direction. The derived mark features 124 are designed to be oriented along Y direction.

In the present embodiment, the original mark pattern 100 may include one or more mark feature 102 longitudinally oriented along X direction and one or more mark feature 104 longitudinally oriented along Y direction, as illustrated in FIG. 2A. The derived mark features 124 are oriented along a third direction, which may be X direction, Y direction, or a tilted direction different from X and Y directions. In the present case illustrated in FIG. 3A, the derived mark features 124 are oriented along Y direction.

The derived mark pattern 120 is transferred to the substrate 52 by a patterning process (such as lithography and etching), thereby forming the derived mark pattern 120 having a plurality of the derived mark features 124 on the substrate, as illustrated in FIG. 3B in a sectional view along the dashed line AA' of FIG. 3A and in FIG. 3C in a top view, constructed according to some embodiments.

Figure 4D:
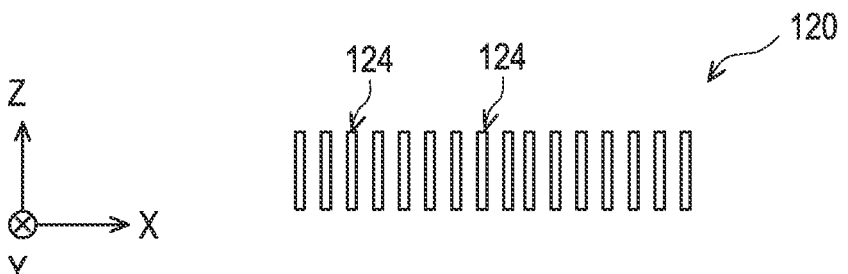
FIG. 4D is a sectional view of the mark feature along AA' of FIG. 4A formed on an IC substrate in accordance with some embodiments.

Turning to FIGS. 4A-4E, a modified mark pattern 120 is illustrated in FIG. 4A. The original mark pattern received from a design layout is same to the mark pattern 100 in FIG. 2A and is therefore presented by a dotted contour 100. In the present embodiment, the mark pattern 100 is received and modified to generate a modified mark pattern 120, which includes a plurality of derived mark features 124 configured in parallel. In the disclosed embodiment, the derived mark features 124 are longitudinally oriented in the same direction. The modified mark pattern 120 is similar to the modified mark pattern 120 of FIG. 3A but it is transferred to the substrate 52 through a different process, such as double patterning process, which includes two lithography processes and two etching processes according to some embodiments. In furtherance of the embodiment, the derived mark features 124 of the modified mark pattern 120 are divided into two subsets 124A and 124B. In one example, the derived mark features 124 in the two subsets are chosen in a way such that the derived mark features 124A in the first subset and the derived mark features 124B in the second subset are alternatively configured, as illustrated in FIG. 4A. During the double patterning process, the patterning process includes two lithography processes using two photomasks 140A and 140B, as illustrated in FIGS. 4B and 4C, respectively. The first subset of the derived mark features 124A are defined on the first photomask 140A and the second subset of the derived mark features 124B are defined on the second photomask 140B.

Figure 4E:
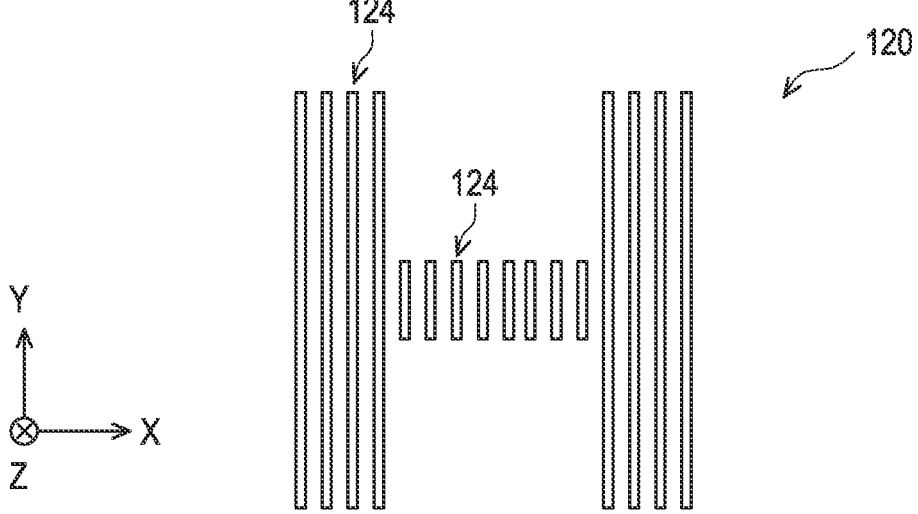
FIG. 4E is a top view of the mark feature of FIG. 4A formed on the IC substrate in accordance with some embodiments.

The derived mark pattern 120 is transferred to the substrate 52 by a double-patterning process using the first and second photomasks 140A and 140B, respectively, thereby collectively forming the modified mark pattern 120 having the plurality of derived mark features 124 (including 124A and 124B) on the substrate 52 as illustrated in FIG. 4D in a sectional view along the dashed line AA' of FIG. 4A and in FIG. 4E in a top view, constructed according to some embodiments.

Figure 5A:
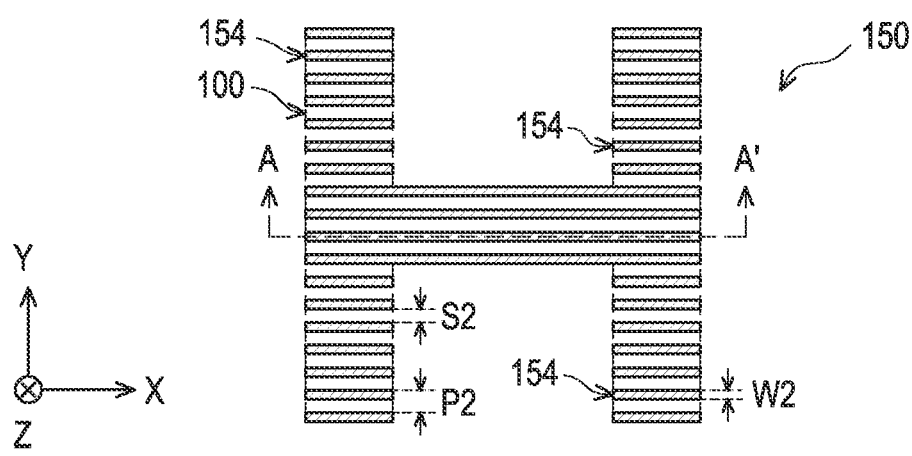
FIG. 5A is a top view of a mark feature constructed in accordance with some embodiments.
Figure 5B:
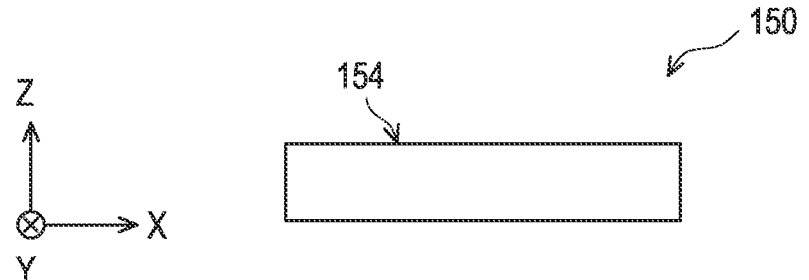
FIG. 5B is a sectional view of the mark feature along AA' of FIG. 5A formed on an IC substrate in accordance with some embodiments.
Figure 5C:
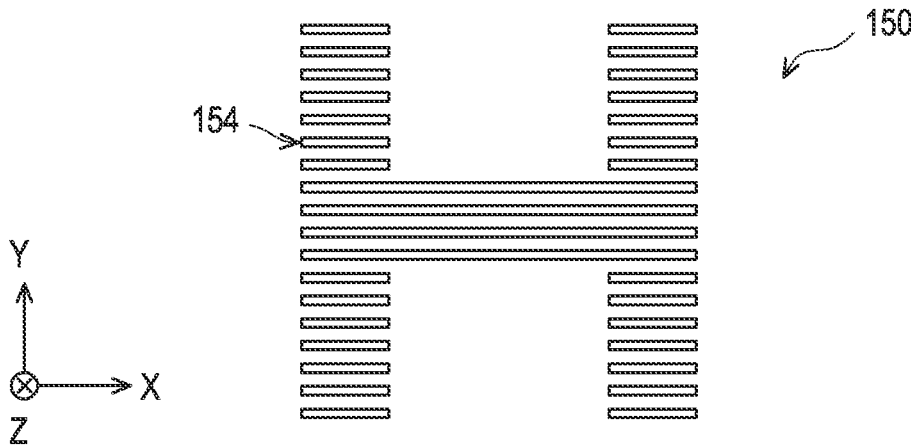
FIG. 5C is a top view of the mark feature of FIG. 5A formed on the IC substrate in accordance with some embodiments.

Turning to FIGS. 5A-5C, a mark pattern 150 is illustrated in FIG. 5A. The original mark pattern in a design layout is same to the mark pattern 100 in FIG. 2A and is therefore presented in FIG. 5A by a dotted contour 100. In the present embodiment, the mark pattern 100 is received and modified to generate a modified mark pattern 150, which includes a plurality of derived mark features 154 oriented in parallel. In the disclosed embodiment, the derived mark features 154 are longitudinally oriented in the same direction. The modified mark pattern 150 may be generated by abstracting portions of the designed mark pattern 100. In furtherance of the embodiment, the derived mark features 154 of the modified mark pattern 150 are configured in a periodic structure. The derived mark features 154 are designed with a same width W2 and configured with a same spacing S2 and a same pitch P2. The pitch P2 is defined as a periodic dimension from one derived mark feature 154 to an adjacent derived mark feature 154, such as between the same corresponding edges of the adjacent derived mark features 154. The pitch P2 is related with the width W2 and spacing S2 by P2=W2+S2. By tunning the dimensions P2 and W2 (or S2 and W2), the pattern density of the modified mark pattern 150 can be tuned, such as reduced. The ratio W2/P2 may determine a local pattern density D. When the ratio W2/P2 is reduced, such as by reducing W2, increasing P2 or a combination thereof, the local pattern density is reduced. When the ratio W2/P2 is increased, such as by reducing P2, increasing W2 or a combination thereof, the local pattern density is increased. In the disclosed embodiment, W2 ranges between 0.001 μm and 2 μm, and S2 ranges between 0.001 μm and 2 μm.

The orientation of the derived mark features 154 is along X direction, which is different from the orientation of the derived mark features 124 in FIG. 3A. As noted above, the orientation of the derived mark features also provides a freedom to tune various process effects, such as pattern uniformity or lithography process. Proper orientation of the derived mark features can effectively enhance the lithography resolution.

In the present embodiment, the original mark pattern 100 may include one or more mark feature 102 longitudinally oriented along X direction and one or more mark feature 104 longitudinally oriented along Y direction, as illustrated in FIG. 2A. The derived mark features 154 are oriented along a third direction, which may be X direction, Y direction, or a tilted direction different from X and Y directions. In the present case illustrated in FIG. 5A, the derived mark features 154 are oriented along X direction.

The derived mark pattern 150 is transferred to the substrate 52 by a patterning process (such as lithography and etching), thereby forming the derived mark pattern 150 having a plurality of the derived mark features 154 on the substrate 52, as illustrated in FIG. 5B in a sectional view along the dashed line AA' of FIG. 5A and in FIG. 5C in a top view, constructed according to some embodiments.

Figure 6A:
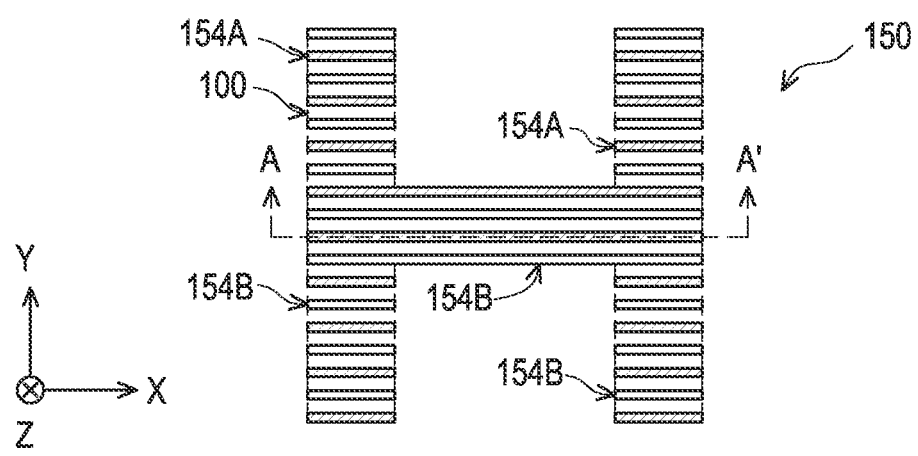
FIG. 6A is a top view of a mark feature constructed in accordance with some embodiments.
Figure 6B:
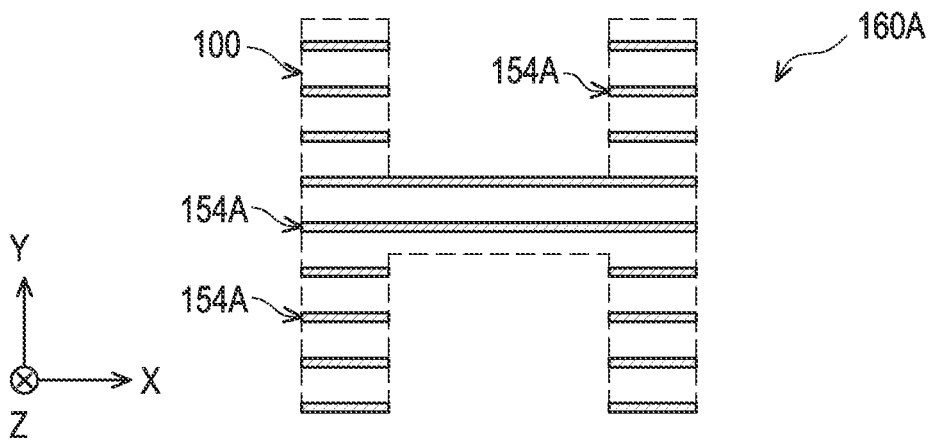
FIGS. 6B and 6C are top views of photomasks having the mark feature of FIG. 6A constructed in accordance with some embodiments.
Figure 6C:
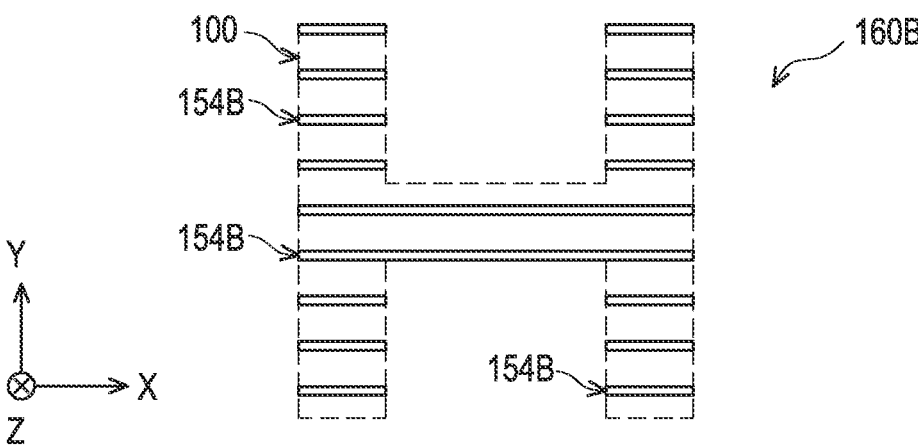

Turning to FIGS. 6A-6E, a modified mark pattern 150 is illustrated in FIG. 6A. The original mark pattern received from a design layout is same to the mark pattern 100 in FIG. 2A and is therefore presented by a dotted contour 100. The modified mark pattern 150 is same to the modified mark pattern 150 illustrated in FIG. 5A. In the present embodiment, the mark pattern 100 is received and modified to generate a modified mark pattern 150, which includes a plurality of derived mark features 154 configured in parallel. In the disclosed embodiment, the derived mark features 154 are longitudinally oriented in the same direction. However, the modified mark pattern 150 is transferred to the substrate 52 by a different process, such as double patterning process, which includes two lithography processes and two etching processes according to some embodiments. In furtherance of the embodiment, the derived mark features 154 of the modified mark pattern 150 are divided into two subsets 154A and 154B. In one example, the derived mark features 154 in the two subsets are chosen in a way such that the derived mark features 154A in the first subset and the derived mark features 154B in the second subset are alternatively configured, as illustrated in FIG. 6A. During the double patterning process, the patterning process includes two lithography processes using two photomasks 160A and 160B, as illustrated in FIGS. 6B and 6C, respectively. The first subset of the derived mark features 154A are defined on the first photomask 160A and the second subset of the derived mark features 154B are defined on the second photomask 160B.

Figure 6D:
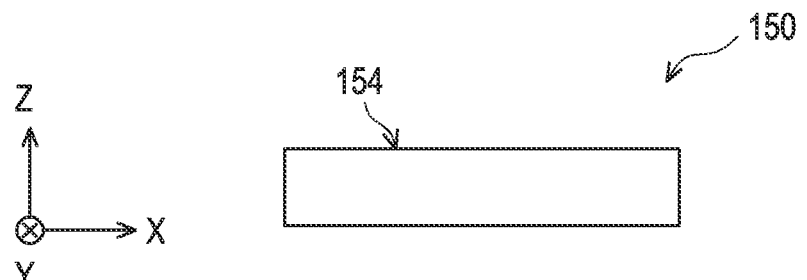
FIG. 6D is a sectional view of the mark feature along AA' of FIG. 6A formed on an IC substrate in accordance with some embodiments.
Figure 6E:
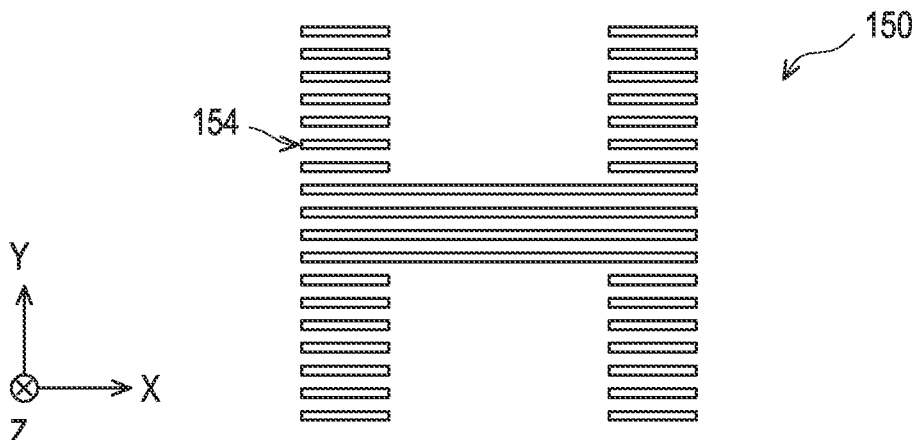
FIG. 6E is a top view of the mark feature of FIG. 6A formed on the IC substrate in accordance with some embodiments.

The derived mark pattern 150 is transferred to the substrate 52 by a double-patterning process using the first and second photomasks 160A and 160B, respectively, thereby collectively forming the modified mark pattern 150 having the plurality of derived mark features 154 (including 154A and 154B) on the substrate 52 as illustrated in FIG. 6D in a sectional view along the dashed line AA' of FIG. 6A and in FIG. 6E in a top view, constructed according to some embodiments.

Turning to FIGS. 7A-7C, a mark pattern 170 is illustrated in FIG. 7A. The original mark pattern in a design layout is same to the mark pattern 100 in FIG. 2A and is therefore presented in FIG. 7A by a dotted contour 100. In the present embodiment, the mark pattern 100 is received and modified to generate a modified mark pattern 170, which includes a plurality of derived mark features 174 oriented in parallel. In the disclosed embodiment, the derived mark features 174 are longitudinally oriented in the same direction. The modified mark pattern 170 may be generated by abstracting portions of the designed mark pattern 100. In furtherance of the embodiment, the derived mark features 174 of the modified mark pattern 170 are configured in a periodic structure. The derived mark features 174 are designed with a same width W3 and configured with a same spacing S3 and a same pitch P3. The pitch P3 is defined as a periodic dimension from one derived mark feature 174 to an adjacent derived mark feature 174, such as between the same corresponding edges of the adjacent derived mark features 174. The pitch P3 is related with the width W3 and spacing S3 by P3=W3+S3. By tunning the dimensions P3 and W3 (or S3 and W3), the pattern density of the modified mark pattern 170 can be tuned, such as reduced. The ratio W3/P3 may determine a local pattern density D. When the ratio W3/P3 is reduced, such as by reducing W3, increasing P3 or a combination thereof, the local pattern density is reduced. When the ratio W3/P3 is increased, such as by reducing P3, increasing W3 or a combination thereof, the local pattern density is increased. In the disclosed embodiment, W3 ranges between 0.001 µm and 2 µm, and S3 ranges between 0.001 µm and 2 µm.

The orientation of the derived mark features 174 is along a tilted direction 176, which is different from X direction and Y direction. As noted above, the orientation of the derived mark features also provides a freedom to tune various process effects, such as pattern uniformity or lithography process. Proper orientation of the derived mark features can effectively enhance the lithography resolution.

In the present embodiment, the original mark pattern 100 may include one or more mark feature 102 longitudinally oriented along X direction and one or more mark feature 104 longitudinally oriented along Y direction, as illustrated in FIG. 2A. The derived mark features 174 are oriented along a third direction, which is different from X and Y directions. In some embodiments, the tilted orientation 176 has an angle θ to X direction, and the angle θ ranges between 0 and π. When the angle θ=0, the modified mark pattern 170 is similar to the modified mark pattern 150 in FIG. 5A. When the angle θ=π/2, the modified mark pattern 170 is similar to the modified mark pattern 120 in FIG. 3A.

The derived mark pattern 170 is transferred to the substrate 52 by a patterning process (such as lithography and etching), thereby forming the derived mark pattern 170 having a plurality of the derived mark features 174 on the substrate 52, as illustrated in FIG. 7B in a sectional view along the dashed line AA' of FIG. 7A and in FIG. 7C in a top view, constructed according to some embodiments.

Figure 8A:
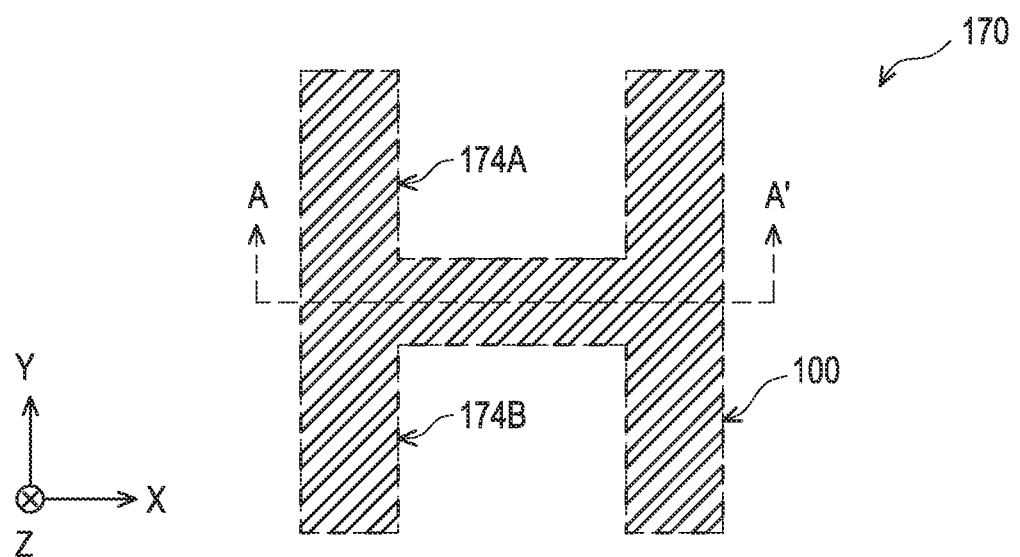
FIG. 8A is a top view of a mark feature constructed in accordance with some embodiments.
Figure 8B:
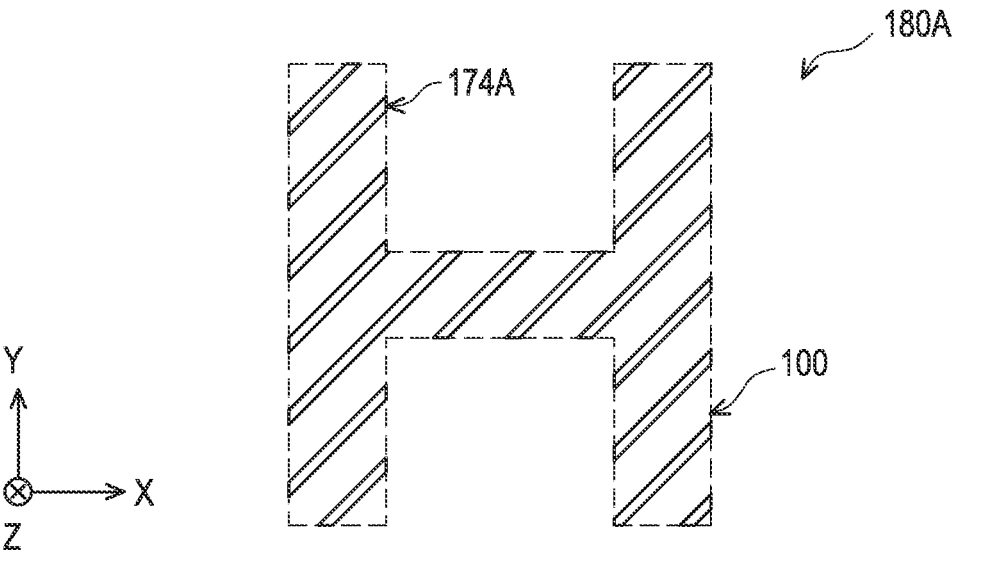

Turning to FIGS. 8A-8E, a modified mark pattern 170 is illustrated in FIG. 8A. The original mark pattern received from a design layout is same to the mark pattern 100 in FIG. 2A and is therefore presented by a dotted contour 100. The modified mark pattern 170 is same to the modified mark pattern 170 illustrated in FIG. 7A. In the present embodiment, the mark pattern 100 is received and modified to generate a modified mark pattern 170, which includes a plurality of derived mark features 174 configured in parallel. In the disclosed embodiment, the derived mark features 174 are longitudinally oriented in the same tilted direction 176. However, the modified mark pattern 170 is transferred to the substrate 52 by a different process, such as double patterning process, which includes two lithography processes and two etching processes according to some embodiments. In furtherance of the embodiment, the derived mark features 174 of the modified mark pattern 170 are divided into two subsets 174A and 174B. In one example, the derived mark features 174 in the two subsets are chosen in a way such that the derived mark features 174A in the first subset and the derived mark features 174B in the second subset are alternatively configured, as illustrated in FIG. 8A. During the double patterning process, the patterning process includes two lithography processes using two photomasks 180A and 180B, as illustrated in FIGS. 8B and 8C, respectively. The first subset of the derived mark features 174A are defined on the first photomask 180A and the second subset of the derived mark features 174B are defined on the second photomask 180B.

The derived mark pattern 170 is transferred to the substrate 52 by a double-patterning process using the first and second photomasks 180A and 180B, respectively, thereby collectively forming the modified mark pattern 170 having the plurality of derived mark features 174 (including 174A and 174B) on the substrate 52 as illustrated in FIG. 8D in a sectional view along the dashed line AA' of FIG. 8A and in FIG. 8E in a top view, constructed according to some embodiments.

FIG. 9 provides a flowchart of a method 200 for constructing a mark pattern 76 according to some embodiments. In the following description, the IC design of the semiconductor structure 50 includes at least one mark pattern, which may be formed in any proper layer over the substrate. The initial mark pattern in the IC design still uses mark pattern 100 in FIG. 2A as an example for illustration. The method 200 is described in detail below with reference to FIGS. 1A-8E and further reference to the following figures.

The method 200 begins at block 202 by receiving an IC design layout that defines a semiconductor structure, such as a semiconductor structure 50 having a mark pattern 76 and circuit features 74 formed in the circuit region 70. In the present example for illustration, the mark pattern 76 includes a mark park pattern 100 as illustrated in FIG. 2A. The mark pattern includes multiple mark features, such as mark features 102 and 104 illustrated in FIG. 2A.

The received mark pattern (such as 100) is also referred to as the initial mark pattern. The method 200 proceeds to a block 204 to fragment the original mark pattern 100 to generate a fragmented mark pattern (modified mark pattern) 100', which includes a plurality of fragmented mark features (derived mark features). The fragmented mark features are straight lines configured in parallel and are longitudinally oriented along a same direction. The fragmented mark features of the fragmented mark pattern 100' collectively represent the original mark pattern 100 and are recognizable as the original mark pattern 100, as explained below. When the ends of the fragmented mark features are connected, they form a closed line as the contour of the original mark pattern. In another perspective, by filling the gaps among the fragmented mark features, the fragmented mark pattern 100' is converted to the original mark pattern 100.

The fragmentation of the received mark pattern 100 may be achieved by any suitable method, such as by abstracting portions of the received mark pattern 100. In some embodiments, the mark pattern 100 is received from the IC design layout and fragmented (modified) by abstraction to generate a modified mark pattern 100', such as 120 in FIG. 3A, 150 in FIG. 5A, 170 in FIG. 7A or other suitable one. The modified mark pattern 100' includes a plurality of derived mark features, such as 124 in FIG. 3A, 154 in FIG. 5A, and 174 in FIG. 7A. In the disclosed embodiment, the modification to the received mark pattern includes abstracting portions of the received mark pattern 100 such that the pattern density of the modified mark pattern 100' is reduced relative to the received mark pattern 100. While implementing the abstraction to the mark pattern 100, various shapes are constructed as reduction features to be abstracted from the received mark pattern 100. In the disclosed embodiment, the abstraction is implemented in a way such that the modified mark pattern 100' includes a plurality of derived mark features configured in parallel. The derived mark features are longitudinally oriented in a same direction. Note that the reduction features of the mark pattern 100 and the derived mark features of the modified mark pattern 100' are complimentary. Accordingly, the reduction features are also configured in parallel and are oriented along the same direction. Especially, the orientation of the derived mark features of the modified mark pattern 100' is not necessarily along the same direction of the circuit features in the same layer. In one example illustrated in FIG. 10A, the semiconductor structure 50 includes various circuit features 74 formed over the substrate 52 and a mark pattern 76 that is adjacent the circuit features 74. The derived mark features 182 of the modified mark pattern 76 and the circuit features 74 are simultaneously formed in a same process and have same composition(s). Furthermore, the circuit features 74 and the derived mark features 182 are defined on a same photomask; and forming the circuit features 74 and the derived mark features 182 on the semiconductor substrate simultaneously by a lithography process using the photomask.

As an illustrative example, the circuit features 74 are metal lines in one metal layer (e.g., $1^{st}$ metal layer, $2^{nd}$ metal layer over the $1^{st}$ metal layer, or etc.). The circuit features 74 in the same metal layer are longitudinally oriented in the same direction (Y direction in the present example). The mark pattern 76 includes derived mark features 182 that are also metal lines of compositions similar to the circuit features 74. However, the derived mark features 182 are longitudinally oriented along a direction 184, which is different from the orientation of the circuit features 74. The direction 184 is a tilted direction and has an angle θ with X direction. Furthermore, the line width W0 of the derived mark features 182 is different from the line width of the circuit features 74. The derived mark features 182 are configured in a periodic structure with a spacing S0 and a pitch P0. The parameters (W0, S0, P0, and θ) are all tuned for fabrication effect, such as reduced pattern density and increased process window, while the line width of the circuit features 74 and corresponding configuration are configured according to the designed circuit specification. For example, the parameters of the derived mark features 182 are provided in FIGS. 3A-8E, while the line width of the circuit features 74 may range between 10 nm and 100 nm, depending on feature characteristics (active regions, gate electrodes or metal lines) and technology nodes. In other examples, the circuit features 74 may be active regions of a semiconductor material, gate electrodes of one or more conductive material, conductive features in the RDL, bonding pads of one or more conductive material, and etc. The derived mark features 182 also formed in the same layer, have the same compositions, and are simultaneously formed with the circuit features 74 in a same process.

FIG. 10B is similar to FIG. 10A but the circuit features 74 are longitudinally oriented along X direction. FIG. 10C is similar to FIG. 10A but both the circuit features 74 and the derived mark features 182 are longitudinally oriented along Y direction. FIG. 10D is similar to FIG. 10A but the circuit features 74 are longitudinally oriented along X direction while the derived mark features 182 are longitudinally oriented along Y direction.

In order to the fragmented mark pattern 100' is recognizable, the spacing S0 and the width W0 are comparable or a ratio W0/P0 is in a proper range. If the ratio W0/P0 is too small, the fragmented mark features are too thin to be detectable or visible. If the ratio W0/P0 is too large, the pattern density cannot be effectively reduced. In some examples, the ratio W0/P0 ranges between 0.2 and 0.8.

In the block 204, the reduction features may be initially defined according to manufacturing data, such as previously fabricated products. The modified mark pattern includes various parameters, such as orientation, width, spacing and pitch.

The method 200 may proceed to a block 206 by evaluating if the pattern density of the modified mark pattern is within a desirable range such that the loading effect is minimized. This may be implemented through various methods. In one embodiment, the average pattern density of the modified mark pattern is compared with the average pattern density of the circuit features in the same layer. If the difference of the pattern densities is less than a certain criterion, then the loading effect is neglectable. The criterion may be determined based on the manufacturing data. In another embodiment, the evaluation is through a simulation (such as a simulation tool to simulate CMP or etching process) to determine the loading effect and the process window. If the evaluation at block 206 indicates that the pattern density of the modified mark pattern 100' is not within the desirable range, the method 200 may move back to the block 204 to do further abstraction. Alternatively, the block 204 may alternatively include adding features to the previously modified mark pattern such that the modified mark pattern is fine-tuned dual way to a proper pattern density. In some embodiments, when the method 200 moves back to the block 204, the further modification may only include retuning/adjusting W0, S0 (or P0) and θ.

The method 200 may proceed to a block 208 by evaluating if the lithography resolution of the modified mark pattern is optimized to a desirable range, such as the resolved minimum feature being less than a criterion. This may be implemented through various methods. In one embodiment, the resolved minimum feature is compared with historic data to determine if the resolved minimum feature is reduced or less than the predetermined criterion. In another embodiment, the evaluation is through a simulation (such as a lithography simulation tool to simulate lithography process) to determine if the resolved minimum feature is reduced or less than the predetermined criterion. If the evaluation at block 208 indicates that the resolution of the modified mark pattern 100' is not within the desirable range, the method 200 may move back to the block 204 to do further modification to the modified mark pattern, including abstraction, addition, and tuning orientation. In some embodiments, when the method 200 moves back to the block 204, the further modification may only include retuning/adjusting W0, S0 (or P0) and θ.

The method 200 may proceed to block 210 to determine if a double pattern process is adopted, according to the fabrication consideration and other factors. For example, if the lithography process plus double patterning is needed to provide desirable resolution in consideration of the resolution tolerance and fabrication cost, then the method proceeds to the block 212. Otherwise, the method 200 skips block 212 and proceeds to block 214.

At block 212, the derived mark features of the modified mark pattern 100' are grouped (divided) into two subgroups each including a subset of the modified mark features, thereby generating a first double-patterning (DP) mark pattern and a second DP mark pattern, each being to be formed on a respective photomask, such as described in FIGS. 4A-4E, FIGS. 6A-6E, or FIGS. 8A-8E. The circuit features 74 of the same material layer are also divided into two subgroups similarly. For example, the derived mark features of the modified mark pattern 100' are grouped into a first and second subsets of the modified mark features, and the circuit features 74 of the same layer are also grouped into a third and fourth subsets of the circuit features. The first subset of the modified mark features and the third subset of the circuit features are defined on a first photomask, and the second subset of the modified mark features and the fourth subset of the circuit features are defined on a second photomask. Then the modified mask features and the circuit features are formed on the same material layer over the substrate by a double patterning process using the first and second photomasks.

In some embodiments, the double patterning process may use a procedure that further includes two lithography process and two etching. The procedure includes depositing a material layer over the substrate; performing a first lithography process using the first photomask to form a first patterned mask layer over the material layer; performing a first etching process to the material layer through the openings of the first patterned mask layer; performing a second lithography process using the second photomask to form a second patterned mask layer over the material layer; and performing a second etching process to the material layer through the openings of the second patterned mask layer, thereby forming the circuit features and the modified mark features on the material layer.

The method 200 proceeds to block 214. At block 214, a tape-out (or tapeout) is generated for fabrication according to the IC layout that includes the modified mark pattern. The tape-out is the final result of the design process for integrated circuits before they are sent for manufacturing. Particularly, the tape-out may include two patterns for the same layer if the double patterning process is adopted.

The method 200 also includes block 216 by forming a semiconductor structure 50 that includes the modified mark pattern 100' on a substrate 52. In some embodiments, the operations at block 216 includes making photomasks according to the tape-out and making the semiconductor structure 50 on the substrate using the photomasks. In some embodiments, double patterning process is adopted, and dual photomasks are used in the double patterning process to make the circuit features 74 and the modified mark pattern 76 of the same layer on the substrate 52.

The present disclosure provides an IC layout for a semiconductor structure and a method making the same. The semiconductor structure includes a mark pattern (LOGO pattern, such as a letter, number, a symbol or a combination thereof) to be formed with circuit features (such as gates, metal lines, bonding pads, and etc.) on a same material layer over a substrate. The mark pattern is fragmented into a fragmented mark pattern having a plurality of fragmented mark features configured in parallel and oriented along a same direction, which may be along the longitudinal direction of the circuit features, along a direction perpendicular to the longitudinal direction of the circuit features or along a tilted direction. The fragmented mark features may be in a periodic structure having a width, a spacing and a pitch. The embodiments of the present disclosure offer advantages over existing art, though it is understood that other embodiments may offer different advantages, not all advantages are necessarily discussed herein, and that no particular advantage is required for all embodiments. By utilizing the disclosed method and structure. The orientation, width and pitch of the fragmented mark pattern provide freedom to tune the pattern density to reduce the loading effect and enhance the process quality of a subsequent process, such as etching or CMP.

In one example aspect, the present disclosure provides a method that includes receiving a circuit layout that includes circuit features and a mark pattern to be formed on a same material layer over an integrated circuit (IC) substrate, the circuit features being longitudinally oriented along a first direction and being distanced from each other along a second direction that is orthogonal to the first direction; fragmenting the mark pattern to generate a fragmented mark pattern having fragmented mark features such that the fragmented mark features are configured in parallel and are longitudinally oriented along a third direction; and generating a modified circuit layout for circuit fabrication, the modified circuit layout including the circuit features and the fragmented mark pattern.

In another example aspect, the present disclosure provides a method that includes receiving a circuit layout that includes circuit features and a mark pattern, the circuit features being longitudinally oriented along a first direction and being distanced from each other along a second direction that is orthogonal to the first direction; fragmenting the mark pattern to generate a fragmented mark pattern having fragmented mark features configured in parallel and oriented longitudinally along a tilted direction different from the first and second directions; and forming a patterned material layer on a semiconductor substrate, the patterned material layer including the circuit features and the fragmented mark features of the fragmented mark pattern.

In yet another example aspect, the present disclosure provides a method that includes receiving a circuit layout including a mark pattern having a first mark feature longitudinally oriented along a first direction and a second mark feature longitudinally oriented along a second direction being orthogonal to the first direction; abstracting portions of the first and second mark features such that the first and second mark features are converted into a plurality of derived mark features being configured in parallel and oriented longitudinally along a third direction different from the first and second directions; and generating a modified circuit layout for circuit fabrication according to the plurality of derived circuit features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a circuit layout that includes circuit features and a mark pattern to be formed on a same material layer over an integrated circuit (IC) substrate, the circuit features being longitudinally oriented along a first direction and being distanced from each other along a second direction that is orthogonal to the first direction;
   fragmenting the mark pattern to generate a fragmented mark pattern having fragmented mark features such that the fragmented mark features are configured in parallel and are longitudinally oriented along a third direction;
   generating a modified circuit layout for circuit fabrication, the modified circuit layout including the circuit features and the fragmented mark pattern;
   grouping the fragmented mark features of the fragmented mark pattern into a first and second subsets and splitting the circuit features into a third and fourth subsets;
   performing a first lithography process using a first photomask with the first subset of the fragmented mark features and the third subset of the circuit features defined thereon; and performing a second lithography process using a second photomask with the second subset of the fragmented mark features and the fourth subset of the circuit features defined thereon.

2. The method of claim 1, wherein the fragmenting of the mark pattern includes abstracting, from the mark pattern, straight portions longitudinally oriented along the third direction.

3. The method of claim 2, wherein the abstracting straight portions of the mark pattern includes choosing a width and a spacing of the straight portions such that a process window of a subsequent process is increased.

4. The method of claim 3, wherein the subsequent process includes one of a chemical mechanical polishing (CMP) process and an etching process.

5. The method of claim 4, further comprising forming the material layer over the IC substrate according to the modified circuit layout, the material layer being patterned to include the circuit features and the fragmented mark features of the fragmented mark pattern.

6. The method of claim 5, wherein
   the circuit features are fin active regions, gate electrodes, metal lines, or bonding pads; and
   the forming of the material layer includes simultaneously forming the fragmented mark pattern and the circuit features on the IC substrate.

7. The method of claim 1, wherein the third direction is a tilted direction different from the first and second directions.

8. The method of claim 1, wherein
   the third direction is parallel with the first direction; and
   the circuit features include a width less than a width of the fragmented mark features.

9. The method of claim 1, wherein the mark pattern includes at least one of a character, a word, a number, a symbol, and a combination thereof.

10. The method of claim 1, wherein the fragmented mark features are configured as a periodic structure along a fourth direction being orthogonal to the third direction, wherein the fragmented mark features include a same width W, a same spacing S and a same pitch P, and wherein a ratio W/P ranges between 0.2 and 0.8.

11. A method, comprising:
   receiving a circuit layout that includes circuit features and a mark pattern, the circuit features being longitudinally oriented along a first direction and being distanced from each other along a second direction that is orthogonal to the first direction;
   fragmenting the mark pattern to generate a fragmented mark pattern having fragmented mark features configured in parallel and oriented longitudinally along a tilted direction different from the first and second directions;
   grouping the fragmented mark features of the fragmented mark pattern into a first and second subsets and splitting the circuit features into a third and fourth subsets; and
   forming a patterned material layer on a semiconductor substrate, the patterned material layer including the circuit features and the fragmented mark features of the fragmented mark pattern, wherein the forming of the patterned material layer on the semiconductor substrate includes
   performing a first lithography process using a first photomask with the first subset of the fragmented mark features and the third subset of the circuit features defined thereon, and performing a second lithography process using a second photomask with the second subset of the fragmented mark features and the fourth subset of the circuit features defined thereon.

12. The method of claim 11, wherein the mark pattern includes at least one of a character, a word, a number, a symbol, and a combination thereof; and the circuit features are selected from the group consisting of fin active regions, gate electrodes, metal lines, and bonding pads.

13. The method of claim 11, wherein the fragmented mark features are configured as a periodic structure along a fourth direction being orthogonal to the third direction, wherein the fragmented mark features include a same width W, a same spacing S and a same pitch P, and wherein a ratio W/P ranges between 0.2 and 0.8.

14. The method of claim 11, wherein the fragmenting of the mark pattern includes abstracting, from the mark pattern, straight portions longitudinally oriented along the tilted direction.

15. A method, comprising:

receiving a circuit layout including a mark pattern having a first mark feature longitudinally oriented along a first direction and a second mark feature longitudinally oriented along a second direction being orthogonal to the first direction;

abstracting portions of the first and second mark features such that the first and second mark features are converted into a plurality of derived mark features being configured in parallel and oriented longitudinally along a third direction different from the first and second directions, the plurality of derived mark features being spaced from each other along a fourth direction; and generating a modified circuit layout for circuit fabrication according to the plurality of derived mark features, wherein the circuit layout further includes circuit features to be formed with the derived mark features on a same layer over a semiconductor substrate; and the circuit features are configured in parallel and longitudinally oriented along a fifth direction.

16. The method of claim 15, wherein the derived mark features are configured as a periodic structure along the fourth direction being orthogonal to the third direction, wherein the derived mark features include a first width, a first spacing and a first pitch spanning along the fourth direction.

17. The method of claim 16, wherein the circuit features span a second width along a sixth direction being orthogonal to the fifth direction, the second width being less than the first width.

18. The method of claim 17, further comprising forming the circuit features and the derived mark features on the semiconductor substrate, wherein the forming the circuit features and the derived mark features includes defining the circuit features and the derived mark features on a same photomask, and forming the circuit features and the derived mark features on the semiconductor substrate simultaneously by a lithography process using the photomask.

19. The method of claim 18, wherein the mark pattern includes at least one of a character, a word, a number, a symbol, and a combination thereof; and the circuit features are selected from the group consisting of fin active regions; gate electrodes, metal lines, and bonding pads.

20. The method of claim 15, wherein the first mark feature is disposed in a first region and the second mark feature is disposed in a second region;

the first and second mark features are connected; and at least one of the derived mark features extends longitudinally from the first region to the second region.

\*   \*   \*   \*   \*